(12) United States Patent
Sandström

(10) Patent No.: US 8,743,165 B2
(45) Date of Patent: Jun. 3, 2014

(54) METHODS AND DEVICE FOR LASER PROCESSING

(75) Inventor: Torbjörn Sandström, Pixbo (SE)

(73) Assignee: Micronic Laser Systems AB, Taby (SE)

( * ) Notice: Subject to any disclaimer, the term of this patent is extended or adjusted under 35 U.S.C. 154(b) by 245 days.

(21) Appl. No.: 13/039,281

(22) Filed: Mar. 2, 2011

(65) Prior Publication Data

US 2011/0240611 A1    Oct. 6, 2011

Related U.S. Application Data

(60) Provisional application No. 61/311,271, filed on Mar. 5, 2010.

(51) Int. Cl.
| | |
|---|---|
| *G02B 26/00* | (2006.01) |
| *G02B 26/08* | (2006.01) |
| *G02B 27/10* | (2006.01) |
| *G03F 7/20* | (2006.01) |
| *B41J 2/447* | (2006.01) |
| *B41J 2/455* | (2006.01) |
| *B23K 26/00* | (2014.01) |
| *H01L 21/302* | (2006.01) |
| *B23K 26/08* | (2014.01) |

(52) U.S. Cl.
CPC .............. *H01L 21/302* (2013.01); *B23K 26/08* (2013.01); *B23K 26/0066* (2013.01)
USPC ........... 347/225; 347/255; 359/619; 430/311; 372/26; 264/400; 264/482; 219/121.68

(58) Field of Classification Search
USPC .......... 347/225, 134, 239, 255; 264/400, 405, 264/482; 372/26; 430/311; 359/259, 263, 359/298, 316, 318, 619; 219/121.68, 219/121.69; 425/174.4; 355/53, 67; 250/492.1, 494.1, 503.1

See application file for complete search history.

(56) References Cited

U.S. PATENT DOCUMENTS

| | | |
|---|---|---|
| RE33,931 E | 5/1992 | Whitney |
| 5,208,818 A | 5/1993 | Gelbart et al. |
| 6,133,986 A | 10/2000 | Johnson |

(Continued)

FOREIGN PATENT DOCUMENTS

| | | |
|---|---|---|
| EP | 1155865 A2 | 11/2001 |
| EP | 1628162 A2 | 2/2006 |

OTHER PUBLICATIONS

Hyper Rpd 50, High Power Industrial Picosecond Laser product data sheet, Lumera Laser, GmbH, downloaded from http://www.lumera-laser.com/hyper_rapid_50.html, Feb. 11, 2011.

(Continued)

*Primary Examiner* — Samuel M Heinrich
(74) *Attorney, Agent, or Firm* — Haynes Beffel & Wolfeld LLP; Christopher Blizzard

(57) ABSTRACT

The present invention relates to laser ablation microlithography. In particular, we disclose a new SLM design and patterning method that uses multiple mirrors per pixel to concentrate energy to an energy density that facilitates laser ablation, while keeping the energy density on the SLM mirror surface at a level that does not damage the mirrors. Multiple micromirrors can be reset at a very high frequency, far beyond current DMD devices.

30 Claims, 12 Drawing Sheets

(56) References Cited

U.S. PATENT DOCUMENTS

| | | |
|---|---|---|
| 6,248,988 B1 | 6/2001 | Krantz |
| 6,423,935 B1 | 7/2002 | Hackel et al. |
| 6,473,237 B2 * | 10/2002 | Mei ............................. 359/619 |
| 6,566,627 B2 * | 5/2003 | Brandinger et al. ..... 219/121.69 |
| 6,870,172 B1 | 3/2005 | Mankos et al. |
| 7,359,029 B2 * | 4/2008 | Finders et al. .................. 355/30 |
| 2002/0159044 A1 | 10/2002 | Mei et al. |
| 2003/0123040 A1 | 7/2003 | Almogy |
| 2004/0004699 A1 | 1/2004 | Kanatake |
| 2005/0002002 A1 | 1/2005 | Shirota et al. |
| 2005/0087701 A1 | 4/2005 | Lammer-Pachlinger et al. |
| 2006/0119743 A1 | 6/2006 | Lin |
| 2006/0132746 A1 | 6/2006 | Baselmans et al. |
| 2007/0197049 A1 * | 8/2007 | Tanaka et al. .................. 438/795 |
| 2008/0109618 A1 | 5/2008 | Kim et al. |
| 2009/0303571 A1 | 12/2009 | Sandstrom |
| 2010/0141829 A1 | 6/2010 | Jalali et al. |
| 2010/0208329 A1 | 8/2010 | Sandstrom et al. |

OTHER PUBLICATIONS

International Search Report, PCT/EP2011/053336, mailed May 30, 2011, pp. 1-4.

Written Opinion of the International Preliminary Examining Authority, PCT/EP2011/053336, mailed Jun. 22, 2012, pp. 1-8.

Response to 93(4) Communication European Application No. 09801678.5, filed Jan. 10, 2013, pp. 1-40.

* cited by examiner

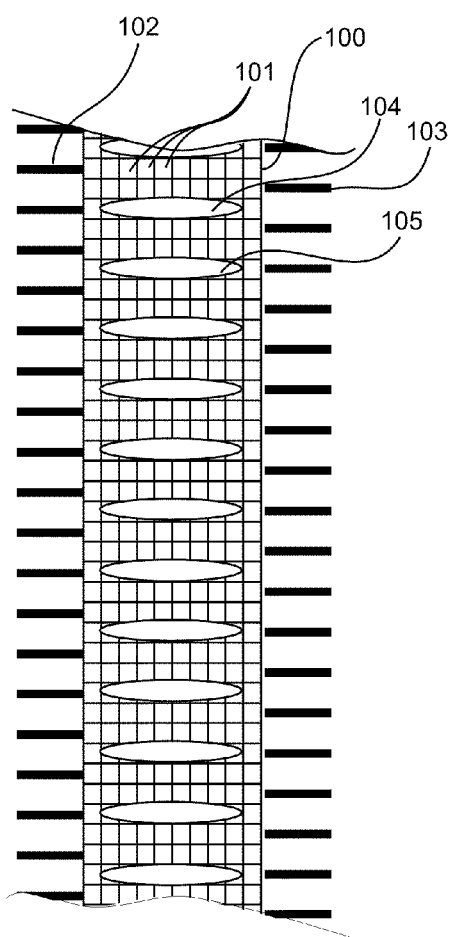
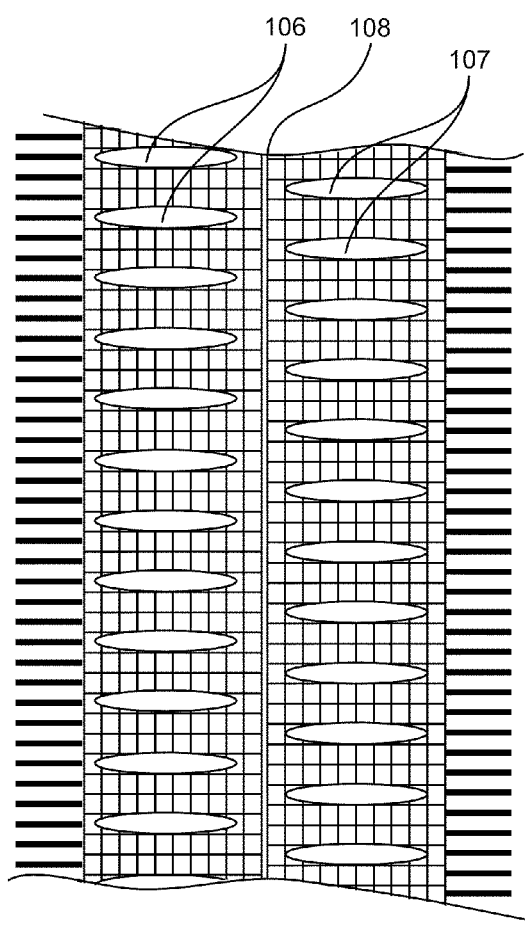
Figure 1A                    Figure 1B

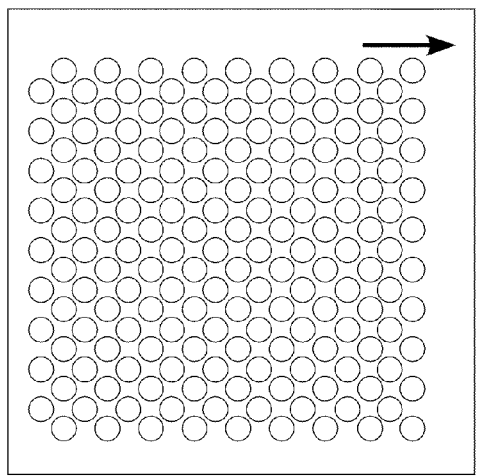 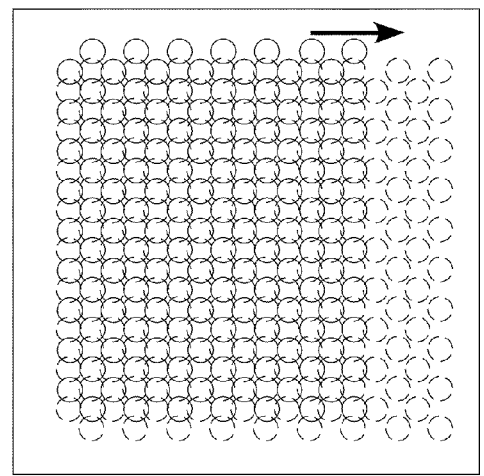
Figure 6E                    Figure 6F

METHODS AND DEVICE FOR LASER PROCESSING

RELATED APPLICATION

This application claims the benefit of U.S. Provisional Patent Application No. 61/311,271 entitled "Methods and Device for Laser Ablation," filed Mar. 5, 2010. The priority application is incorporated by reference.

This application is related to and incorporates by reference U.S. patent application Ser. No. 12/626,581, entitled "Image Reading And Writing Using A Complex Two-Dimensional Interlace Scheme," filed on Nov. 25, 2009 [MLSE 1098-2/P00339], which discloses methods and systems that use large SLMs with many pixels.

This application is related to and incorporates by reference U.S. patent application Ser. No. 12/706,624, entitled "SLM Device And Method Combining Multiple Mirrors For High-Power Delivery," filed on Feb. 16, 2010 [MLSE 1101-2/P00346], which discloses SLMs having improved image quality, modulation speed, and power handling.

This application is further related to and incorporates by reference U.S. patent application Ser. No. 12/718,904 entitled "Illumination Methods and Devices for Partially Coherent Illumination," filed on Mar. 5, 2010 [MLSE 1109-2/P00359]. The pulses described herein may be pseudo-pulses from a continuous laser or mode locked quasi continuous laser processed through a virtual pupil, as described in the referenced application. The workpiece tracker described in the referenced application also may be used with ablation technology described in this document.

BACKGROUND OF THE INVENTION

The present invention relates to laser ablation microlithography and more generally to laser patterning using pulsed laser light. In particular, we disclose a new SLM design and patterning method that uses multiple mirrors per pixel to concentrate energy to an energy density that facilitates laser ablation, while keeping the energy density on the SLM mirror surface at a level that does not damage the mirrors. Multiple micro-mirrors can be reset at a very high frequency, far beyond current DMD devices made by and commercially available from Texas Instruments, TX. This design may usefully be combined with the writing pattern described in U.S. patent application Ser. No. 12/626,581.

Currently most lithography, e.g., for production of LCD displays, is done conventionally using a photoresist, which after exposure and development becomes an etch mask used to delineate a pattern in a uniform film deposited over the entire area prior to the patterning. This procedure ensures high quality, but involves many steps, and in some cases, most of the expensive material that has been blanket deposited goes to waste. Therefore, there is an active search for new processes that reduce the number of process steps and/or use less material. A number of such methods are known which use concentrated pulsed light to transfer material to the workpiece or modify the surface or a surface film. The exposure per pulse may be in range 1 to 5 $J/cm^2$, although in other cases energy densities in the range of 0.1 to 1 $J/cm^2$ may suffice.

It is known in the art to pattern photoresist and ablate films using masks. It is also known to use DMD devices instead of a mask. The throughput for DMD direct laser ablation is low because of the moderate power density and update rate that can be achieved with a DMD. By design, typical DMD mirrors act as individual modulators and have an area of 11×11 or 13×13 microns. The pulse power per mirror is limited partly by the size of the mirrors, partly by the risk of damaging or disturbing the function of the underlying CMOS or the function of the MEMS. DMD devices typically have a frame rate of 20-30 kHz, or up to about 70 kHz when only a small part of the chip area is updated. With limited frame rate and limited pulse energy, the average power is inadequate for many applications of ablation. It is known in the art to use Liquid Crystal on Silicon ("LCOS") SLMs to control a multibeam ablation system. LCOS devices are slow in comparison, typically operating at 50-200 Hz and can possibly be optimized to operate in the low kilohertz range.

Ablation using an early model of TI's DMD is described in U.S. Pat. No. 5,208,818 (1993). A DMD of 1,000×1,000 pixel modulators is demagnified by a ratio of 85× onto an area 200×200 microns. An SLM produces an image that the system steps by 100 microns between laser pulses. Each modulator is separately driven and imaged from the DMD onto the substrate, with symmetrical demagnification. It is difficult to make many mirrors to contribute to one diffraction-limited laser spot on the workpiece, since the DMD is not designed for phase coherence from mirror to mirror. Therefore, the demagnification is at best one mirror area to one ablation spot. The technology disclosed can overcome such limits and allow high or extremely high energy density in the pulses which hit the workpiece.

It is known in the art to create a surface topography by laser ablation of the surface material. It is also known to blanket deposit a thin film, e.g. an organic, semiconducting, inorganic dielectric, or metallic film, and pattern it by laser ablation. It is further known to deposit a mask material, e.g. a polymer on top of the film, and pattern the mask material by laser ablation and use the remaining mask as an etch mask to pattern the film. Furthermore it is known to deposit a mask material, e.g. a polymer film, before the blanket deposition of the film and do a lift-off to pattern the film. Instead of the blanket deposition a selective deposition in certain areas may be done, e.g. by ink jetting, and the deposited areas may be trimmed by laser ablation, either directly or with the heat of an ablation-patterned etch or lift-off mask. It is further known to perform the ablation in air, inert gas, liquid, or vacuum. Ablation has been performed from the front side of the workpiece and from the backside of a transparent workpiece. US Patent Publication 2010/0141829 A1 mentions laser ablation using a powerful continuous-wave or pulse laser on top of a so-called spectral brush, primarily for medical applications identified as "laser therapy, laser cutting, and laser surgery." Paragraph 0035. Spectral encoding of spatial information into back-reflection of the laser beam is an important feature of that publication. Paragraph 0016.

U.S. Pat. No. 6,423,925 (2002) describes laser peening of metal surfaces, which generates a shock wave as intense as $10^6$ psi, thereby changing the metal surface. Col. 4, line 45. A spatial light modulator is mentioned, with the caution that the high fluence of the laser beam could be problematic in the selection and use of an SLM. Col. 6, line 59.

International Publication WO 2008/109618 A2 mentions laser ablation in the context of a substrate for holographic blank. Page 9. Polymers are identified as a good candidate for ablation material. Page 14. A state of the art description of Micro-Mirror Arrays is offered at page 20.

The disclosed methods and apparatuses are suitable for patterning by laser pulses, while the current application avoids damage to an SLM caused by high power concentrations on the SLM surface and allows improved throughput.

SUMMARY OF THE INVENTION

The present invention relates to laser ablation microlithography. In particular, we disclose a new SLM design and patterning method that uses multiple mirrors per pixel to concentrate energy to an energy density that facilitates laser ablation, while keeping the energy density on the SLM mirror surface at a level that does not damage the mirrors. Multiple micro-mirrors can be reset at a very high frequency, far beyond current DMD devices. This design may usefully be combined with the writing pattern described in U.S. patent application Ser. No. 12/626,581. Particular aspects of the present invention are described in the claims, specification and drawings.

BRIEF DESCRIPTION OF THE DRAWINGS

FIG. 1A shows part of a 1D SLM with a single row of pixels, each pixel including many mirrors, and one light beamlet/spot on every third pixel.

FIG. 1B shows an SLM with two rows of pixels and twice the number of beamlets.

FIGS. 6A-F illustrate some variations on pulse rate and pixel patterns.

DETAILED DESCRIPTION

Figure 1C:
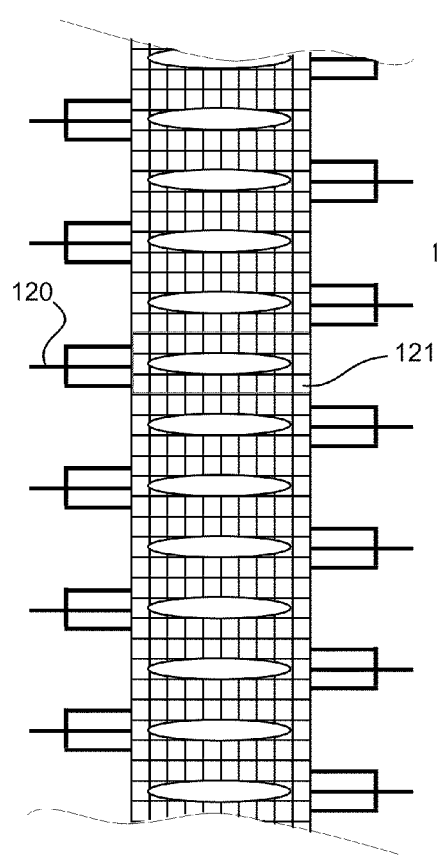
FIG. 1C shows an SLM with multiple rows of mirrors connected together for simpler driving.

The following detailed description is made with reference to the figures. Preferred embodiments are described to illustrate the present invention, not to limit its scope, which is defined by the claims. Those of ordinary skill in the art will recognize a variety of equivalent variations on the description that follows.

The proposed ablation system can be based on the new type of SLM described recently by Micronic Laser Systems in U.S. patent application Ser. No. 12/706,624, entitled "SLM Device And Method Combining Multiple Mirrors For High-Power Delivery" and incorporated by reference. The new type of SLM is a fully passive device with no CMOS onboard, and each pixel is a collection of smaller mirrors, typically rows of mirrors driven by the same terminal. The size of the active area may, for example, be 82 mm×2 mm, or 164 sq. mm. Since the individual mirrors are small, the update rate can be in a range that includes 0.5, 1, 2, or 4 MHz. The SLM is built to withstand average optical power of 50 watts or more.

Multiple micro-mirrors can be reset at a very high frequency, far beyond current DMD devices, because each mirror can be made small. The speed of electrostatically actuated mirrors depends on the ratio between the spring constant and the mass of the mirror. Higher speed can be achieved with higher drive voltage, but at the cost of more difficult driving electronics. The mirrors are, in contrast to DMD devices, diffractive with typical movements of the mirrors by approximately a quarter wavelength, e.g., approximately 250 nm at 1 micron wavelength, and 125, 83, and 63 nm at 0.5, 0.35, and 0.250 microns. The small movements allow the use of stiff springs for a high resonance frequency. The operation is at all times in the elastic regime of the mechanical springs which makes the device robust and reliable. It is particularly beneficial to use pivoting mirrors, which can have a high constant bias voltage that magnifies the effect of the drive voltage and allows stiff springs and high resonance frequency. The pivoting mirror, which are essentially symmetrical with one part of the mirror surface moving towards the light source during actuation and another part moving away from it, allow for good and stable analog modulation of the reflected power. The mirrors are driven by analog voltages from digital-to-analog converter ("DAC") and the reflection of a mirror (and consequently an SLM pixel) is a continuous function of the voltage. As described later this can be used for accurate energy calibration.

In contrast to DMD devices, the mirrors in the SLM described are designed to act as a single optical surface, i.e., the entire surface of the mirrors used as one pixel may be optically flat in the bright state. The mirrors and the MEMS actuation are made with tight flatness, e.g. better than 10 nm flatness error, and consequently good phase control. This allows a collection of mirrors to be operated as one modulator cell or pixel, while the speed is that of the individual small mirror. The size of the pixel area is only limited by practical issues, mainly flatness and the size of the entire device. The collection of mirrors forming a pixel, i.e., one unit of modulation, has an area significantly larger than that of a DMD. It is also significantly larger than one pixel in a grating light valve (GLV) made by Silicon Light Machines.

Several mirrors on the surface on the SLM can be directed to one spot on the workpiece, e.g. a diffraction-limited spot, even though the pixel area is strongly asymmetrical or has a high aspect ration. The SLM pixel area is short, e.g. less than or equal to 20, 10, 8, or 6 microns in the length-wise direction of the SLM array in order to fit as many pixels as possible, e.g. equal to or more than 1024, 2048, 4096, or 8192 pixels in the length of the device. Pixels relatively large in the cross-wise direction, e.g. larger than 0.25, 0.5, or 1 mm to withstand as much power as possible. The pixel is illuminated with spots that are highly asymmetrical in shape and the projection from the highly asymmetrical spots is demagnified by a strongly anamorphic optical system. The anamorphicity may be implemented using different (de)magnification in two directions and/or of the long direction being strongly out of focus and therefore spread out on the SLM.

In a typical embodiment this SLM is illuminated by a pulsed laser that produces pulses in the pico- or femtosecond range and with a repetition frequency of up to the maximum operating frequency of the SLM. Alternatively, multiple pulses can be applied to the SLM per electronic update by a laser producing pulses at a higher frequency than the update frequency of the SLM.

The laser can be a commercial picosecond laser from Lumera Laser (Germany). For higher average power, a laser with suitable properties can be amplified in a disk or fiber amplifier, see for example the paper "Micromachining with a 50 W, 50 µJ, subpicosecond fiber laser system" by Lawrence Shah et al., OPTICS EXPRESS Vol. 14, No. 25 (2006): Splitting the beam and amplifying it using parallel amplifiers (e.g., fibers) can give essentially unlimited power. The beamlets may come from one laser, from multiple lasers, or from multiple amplifiers driven by the same oscillator. The lasers used for ablation typically emit at visible red or near IR, but can be frequency converted to give a wavelength suitable for the ablation at hand, e.g., visibly green, blue or ultra-violet.

There exists an extensive literature on ablation and many industrial applications. Parameters like wavelength, pulse energy density, pulse time, etc. vary widely. The invention may be used with lasers with a variety of pulse lengths, e.g. nanosecond, picoseconds, or femtosecond pulses, but this disclosure concentrates on short pulses. It is known that a picosecond laser can be used to ablate most materials with high quality, low thermal damage and high mass removal rate. This has led to commercial availability of suitable lasers, such as those available from Lumera. Typically, ablation takes place at pulse energy densities around 1-5 J/sq. cm, but some materials require as little as 0.1 mJ to ablate. When the pulse length is less than approximately 5 picoseconds, even transparent materials may be ablated due to so called Coulomb explosion, i.e., the high instantaneous power rips away the valence electrodes in a thin layer of the workpiece material and the material disintegrates. Still shorter pulses in the femtosecond range may be used to cause non-linear effects, such as two-photon processes in materials for material modification, 3D machining, or 3D lithography.

An example of short pulse ablation is described in the paper "Micromachining with a 50 W, 50 µJ, subpicosecond fiber laser system" by Lawrence Shah et al., OPTICS EXPRESS Vol. 14, No. 25 (2006). Pulses from a 1038 nm laser oscillator with 45 MHz pulse repetition frequency are picked and amplified by a chirped fiber amplifier with a grating pulse compressor outputting pulses which are 0.5-1 ps long with an energy of 50 micro Joule. The pulse repetition rate used was 1 MHz, although the authors state that this was only limited by pump power to the amplifier. The beam quality was good across a range of pump and output powers. The laser pulses were used to ablate aluminum, alumina and glass with an ablation rate of 0.17-0.24 mm3/s for the three materials at 40 W average power.

Shah reports a material removal rate that would allow removal of 0.6 square meters of a 1 micron thick film in an hour. Using our disclosed system with multiple mirrors in a single pixel we expect to modulate the mirrors at a high enough data rate and a level of laser power to remove material from several square meters per hour, while creating a pattern on the surface with features down to or even below a micron in size. This is far beyond the capacity of any currently known ablation technique.

Example Embodiment

In one design, we propose using a laser with 50 W average power and 1 MHz repetition rate. The optical efficiency from laser to workpiece may be 50%. The SLM has 8192 pixels and the beam is split and focused to illuminate every third pixel. The unused pixels in between act as separation zones that keep the beamlets from interfering with one another. We have $$\frac{8192}{3} = 2730 \text{ beams,}$$

each with an effective footprint on the SLM of 10*1000 sq. µm, which is 0.01 sq. mm. The pulse energy per mirror is 25 w/2730/1 MHz=10 nJ and the energy density is 100 µJ/sq. cm or 10,000 times too low for ablation. Therefore the mirrors are safe from the pulse energy. After demagnifying the image 40,000 times by area, i.e. making the each spot 0.5*0.5 µm sq., we arrive at 4 J/sq. cm, which is a reasonable ablation power. We now have 25 W energy ablating the workpiece and a pixel rate (number of beamlets times pulse frequency) of 2730*1,000,000=2.7 billion data pixels per second. At this rate, it is calculated that thin films can be ablated with sub-micron resolution at a throughput of 675 sq. mm per second or 2.4 sq. m per hour.

The scheme can be modified by using more or fewer spots on the SLM and higher or lower repetition rate of the laser. FIG. 1A shows part of a 1D SLM with a single row of SLM pixels 100 and one light beamlet/spot 104, 105 on every third SLM pixel. An SLM pixel is the electronically addressable units 100 consisting of multiple mirrors 101 and being addressed by an electronic connection 102. Since the design of the pattern may be given as a pixel map we need to use the term data pixel about one spot written by one laser pulse. The intervening SLM pixels can be set to a dark state by setting them in a deflected or diffractive state that does not relay radiation onto the workpiece. Reflection of radiation between the spots 104, 105, instead of absorption, reduces the accumulation of energy on the SLM surface and associated heating and mirror damage.

Multiple mirrors 101 operate together as a single pixel 100. In one implementation, the multiple mirrors 101 are driven by a single conductor 102, so that the multiple mirrors respond to the same signal. In another implementation depicted by FIGS. 1C-1D, we take this a step further and drive multiple rows of mirrors 121, 122 responsive to the same signal 120. For physical convenience, conductors 102, 103 can be positioned on opposite sides of the mirror array.

Figure 1D:
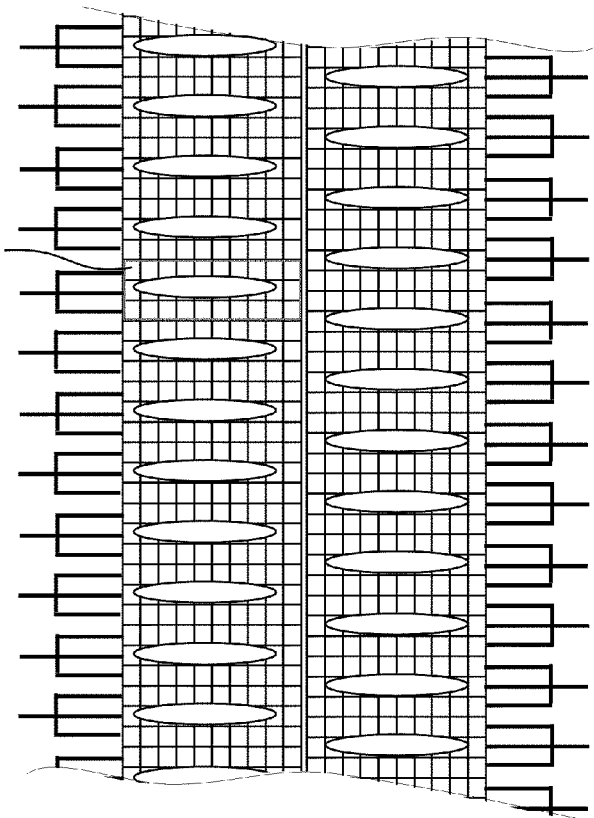
FIG. 1D shows an SLM like in FIG. 1C but with two rows of pixels.

Large numbers of mirrors can function as a single SLM pixel, either mirrors in a single column as depicted in FIGS. 1A-B, or mirrors in adjoining rows and columns as in FIGS. 1C-D. FIG. 1B shows an SLM array 108 with two rows of pixels 106, 107 and twice the number of beamlets. More than two rows may be used. Even more spots can be fitted with lens arrays and apertures stopping the interference between the beams until the ultimate limit of one beamlet per pixel is reached. For microlens arrays and apertures, we refer to and incorporate by reference U.S. 2006/0147841 A1, assigned to Ball Semiconductors. The ultimate number of data pixels per second in the example is 8192*2 MHz=16 Gp/s. To increase the pulse energy density the demagnification can be increased or the pulse rate can be reduced at constant average power.

Figure 1F:
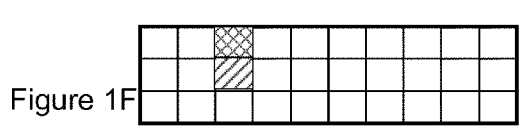
FIGS. 1F-I show how each pixel can be subdivided in mirrors in alternative ways.
Figure 1G:
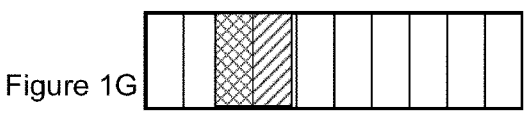
Figure 1H:
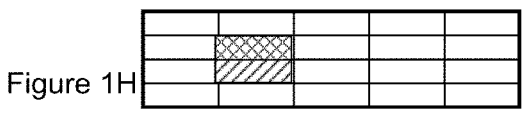
Figure 1I:
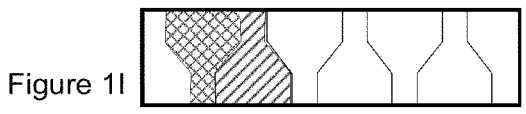

Alternative mirror configurations that combine as a single pixel are depicted in FIGS. 1F-1I. In FIG. 1F, we illustrate square or essentially square pixels that combine as a single pixel. Diagonal and crosshatched fills indicate two mirrors. FIGS. 1G-1H depict rectangular mirrors that have major axes that are vertical and horizontal, respectively, which combine into pixels. Another tessellation, roughly described as a house with chimney, is illustrated in FIG. 1I. In prior applications, other mirror shapes such as diamonds, truncated diamonds, hexagons and "H" shapes have been shown that could be grouped into pixels.

The disclosed ablation system can be used to pattern a thin film or to mill a pattern in a solid surface. This is useful to create a master for embossing or nano-imprinting and the like. Furthermore, the power is high enough for other thermally activated processes like surface hardening, pyrolytic decomposition, and laser induced forward transfer.

Figure 2:
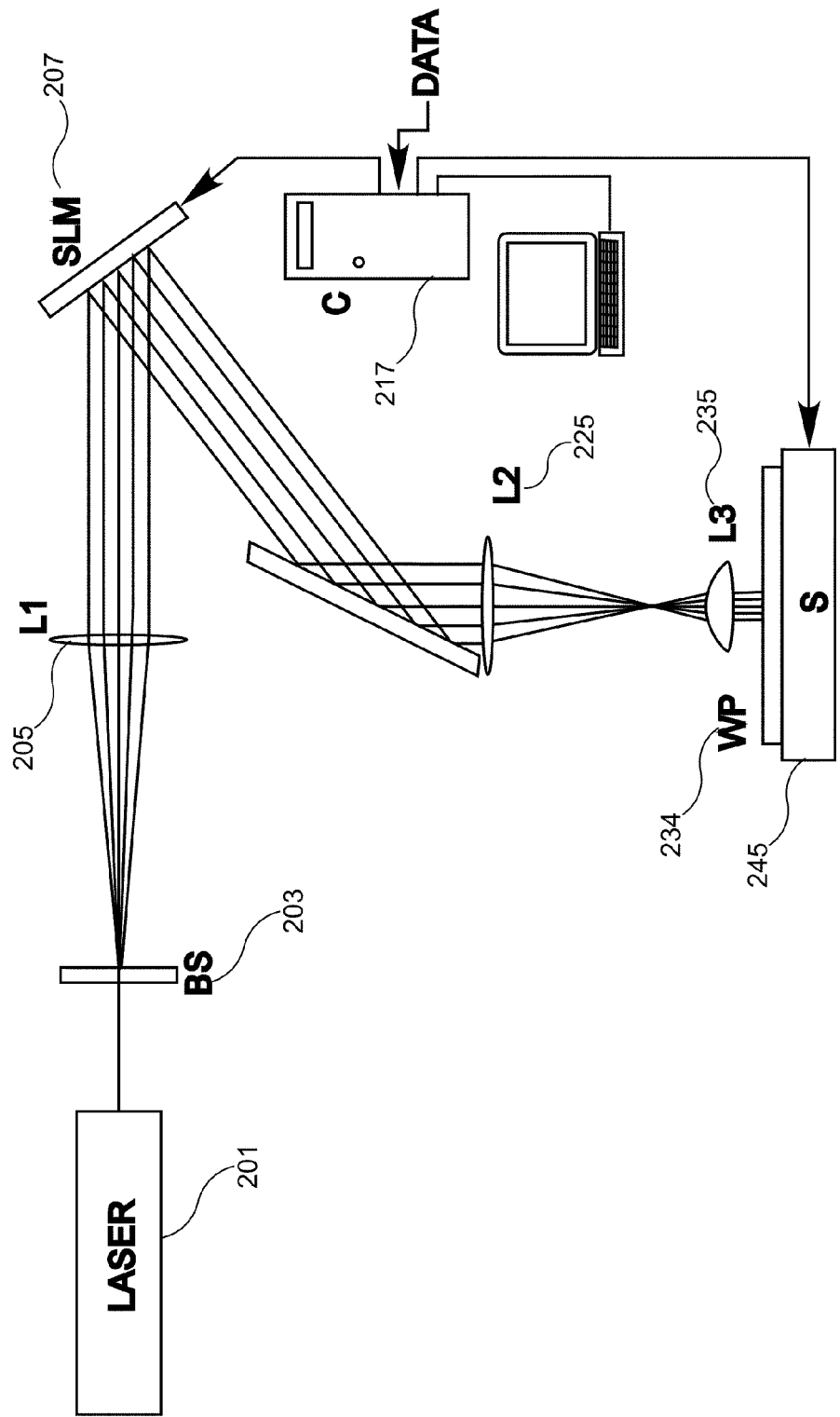
FIG. 2 shows an example of a laser and a beam splitter creating a spot array on the SLM.

FIG. 2 shows an example of an implementation of some of the technology disclosed with a laser 201, a beam splitter 203 and optics 205, creating a spot array on the SLM 207. The beam splitter may be a diffractive fan-out element as known in the art. The light from the SLM 207 is demagnified by the lenses 225 and 235 onto the workpiece 234, which is supported and moved by the stage 245. A computer/controller 217 receives the data and job control instructions, feeds the data to the SLM 207, and controls the stage in synchronicity with the pulses from the laser 201. The lens system 225 and 235, drawn in a simplified form is anamorphoric with different demagnification factors in two directions of the spots on the SLM to the spots on the workpiece.

Figure 4A:
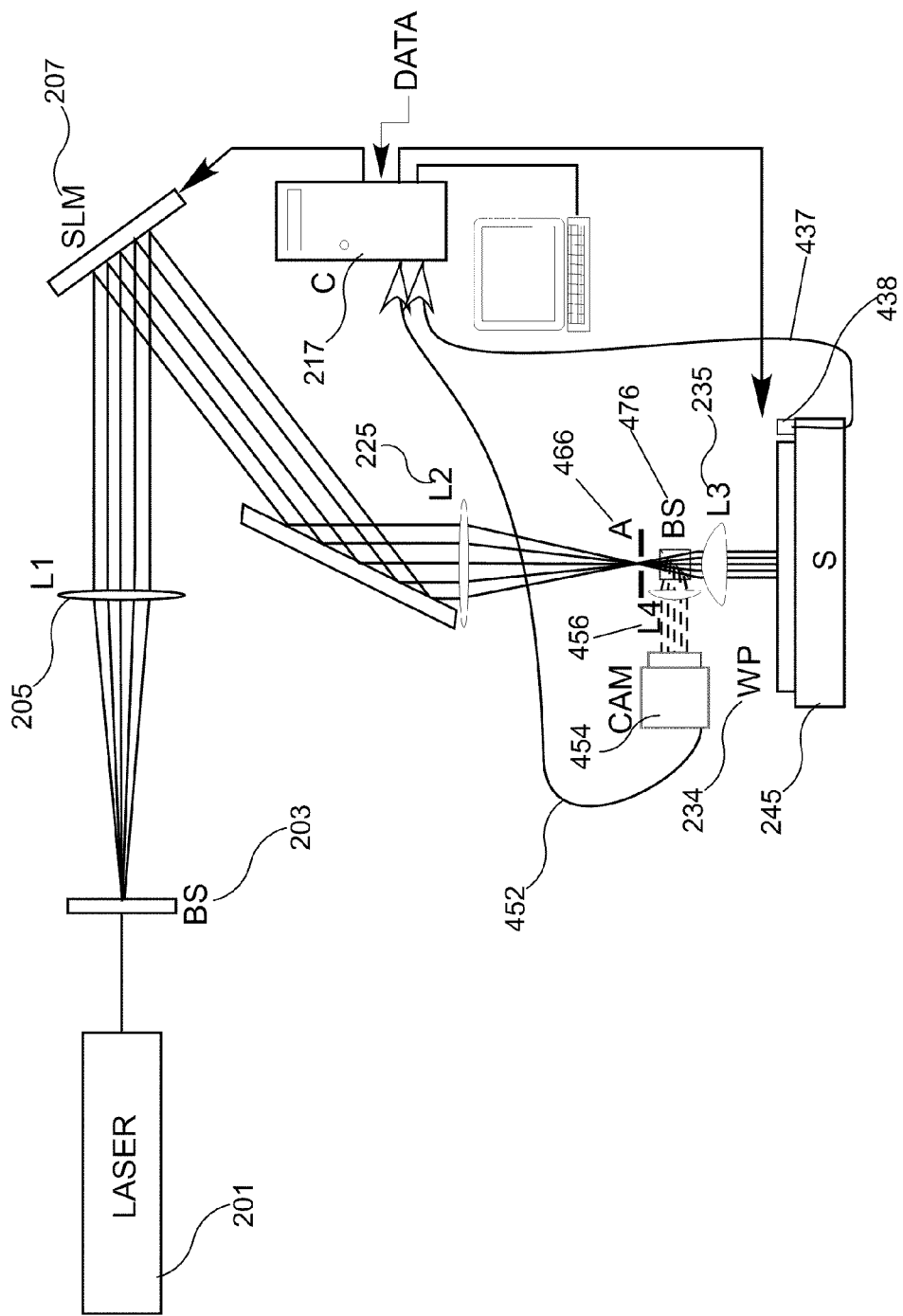
FIG. 4A shows how a high pulse frequency can give high average speed under pulse-energy limitations.

FIG. 4A adds to FIG. 2 a beam splitter or beam sampler 476 positioned after an aperture 466 that is implied in FIG. 2 but omitted for clarity. The beam sampler 476 is asymmetrical in splitting the laser energy between lens 235 onto workpiece 234 and lens 456 onto camera 454. The camera 454 records an image of the spots and sends it 452 to the controller 217 so that the data driving the SLM 207 can be modified and the energy in the spots being equalized and calibrated. Since the mirrors are driven by analog voltages from DACs and the reflection of the pixels are a continuous function of the address voltage modification of the data may be used to control the energy of each spot. The function of the calibration measurement after the system aperture 466 is to measure the true energy as it reaches the workpiece. Alternatively or additionally, a detector 438 on the stage 245 may be connected 437 to the controller 207 for energy measurement and calibration.

Figures 4B, 4C:
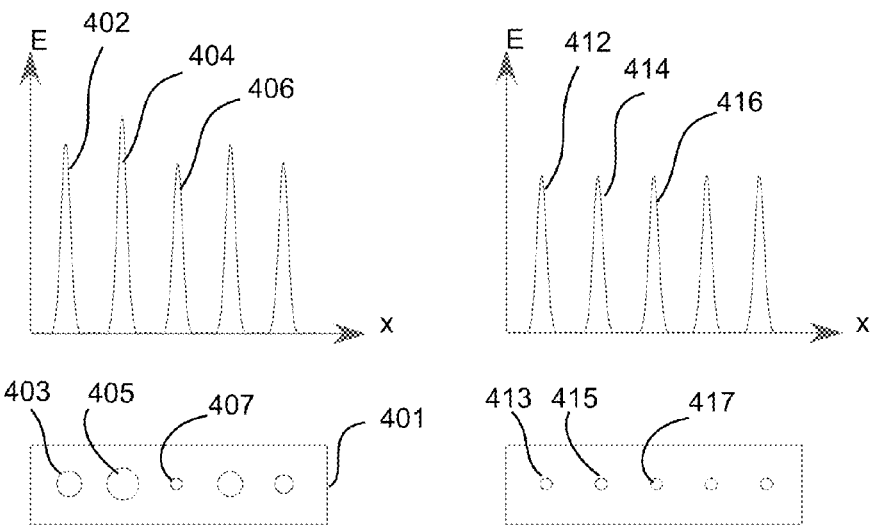
FIGS. 4B-4C illustrate the positive impact of calibration on uniform removal of material.

FIGS. 4B-4C illustrate the positive impact of calibration on uniform removal of material. The figures show at the top the energy of five laser spots on the workpiece and at the bottom the resulting affected areas. Because thermal processes like ablation and laser forward transfer are strongly non-linear, a relatively small difference between energy heights 402, 404, 406, can produce significantly different material removal amounts. Compare 403, 405, 407 on surface 401. With calibration of the spot energies, the energy heights 412, 414, 416 can be equalized and the resulting area removed 413, 415, 417 also equalized. This can be very useful.

Figure 5:
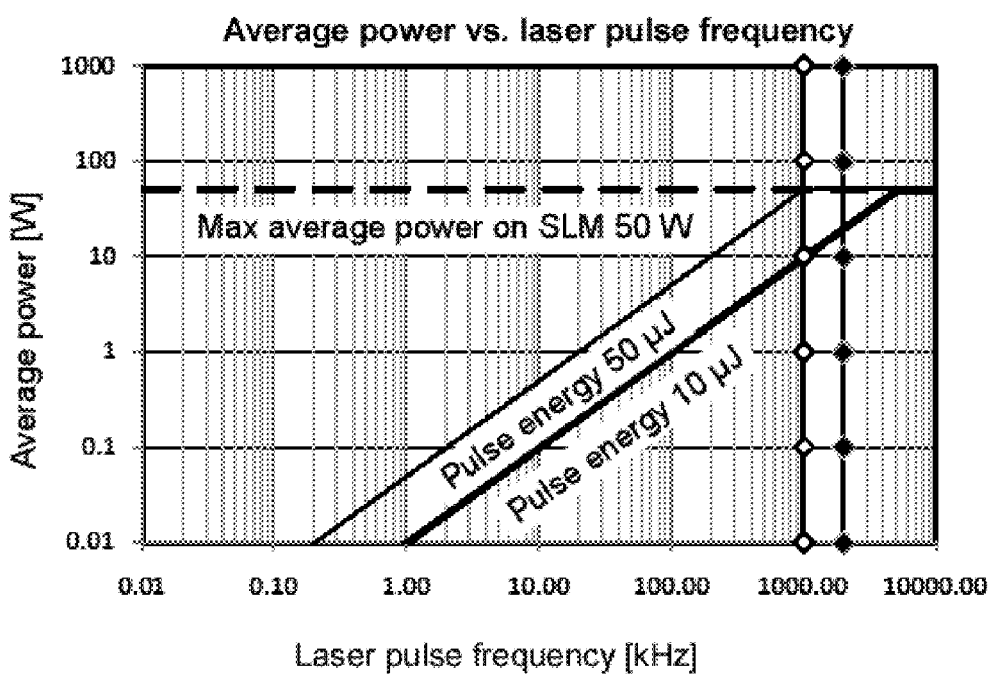
FIG. 5 shows how the material removal rate may be a non-linear function of the pulse energy.

FIG. 5 depicts the relationship between pulse energy, pulse rate and average power and explains why the proposed architecture enables high average power and high throughput. The pulse energy may be limited by several factors. First, the SLM has an upper limit on the pulse energy it can handle, and other parts of the optics also have upper limits. Very short pulses heat an extremely thin layer of the mirrors and therefore the temperature rise is high and fast. Second, many attractive lasers have limited pulse energy by their principle. For example, fiber lasers have limited pulse energy both because of the small amount of pumped material and because of non-linear phenomena in the fiber. Third, high-resolution patterning means small spots and optimum processing condition may involve small energies per spot. Two diagonal lines in the graph depict per-pulse energies of 50 and 10 micro Joules, as labeled. This pulse energy quantity integrates power over the pulse duration, which allows it to be stated without specifying pulse length or pulse repetition rate. The average power, on the vertical axis, is the product of the repetition rate or laser pulse frequency, on the horizontal axis, times the pulse energy. The average power is proportional to the repletion rate or pulse frequency. At a pulse energy of 50 micro Joules, an average power of 50 watts is achieved with a repetition rate of 1 Mhz. Assuming that 50 W average power is the upper limit of what the SLM can endure, there is no possibility to go to higher pulse frequencies. Lower pulse frequencies means lost average power and less throughput. If, on the other hand, the pulse energy is only 10 micro Joules per pulse, the average power has not reached the 50W limit at 1 MHz. At a pulse rate of 2 MHz, a pulse of 10 micro Joules produces an average power of 20 W and the maximum average power is not reached until 5 MHz. It is not inconceivable that the tilting mirrors can be optimized to operate at 5 MHz. Higher laser pulse frequency does in many cases give higher throughput. Other SLMs have limitations: the DMD cannot update faster than approximately 60-70 kHz, the GLV a few hundred kilohertz but with less pulse energy limit, and SLMs based on LCOS typically have update rates of 50-200 Hz.

Figure 3:
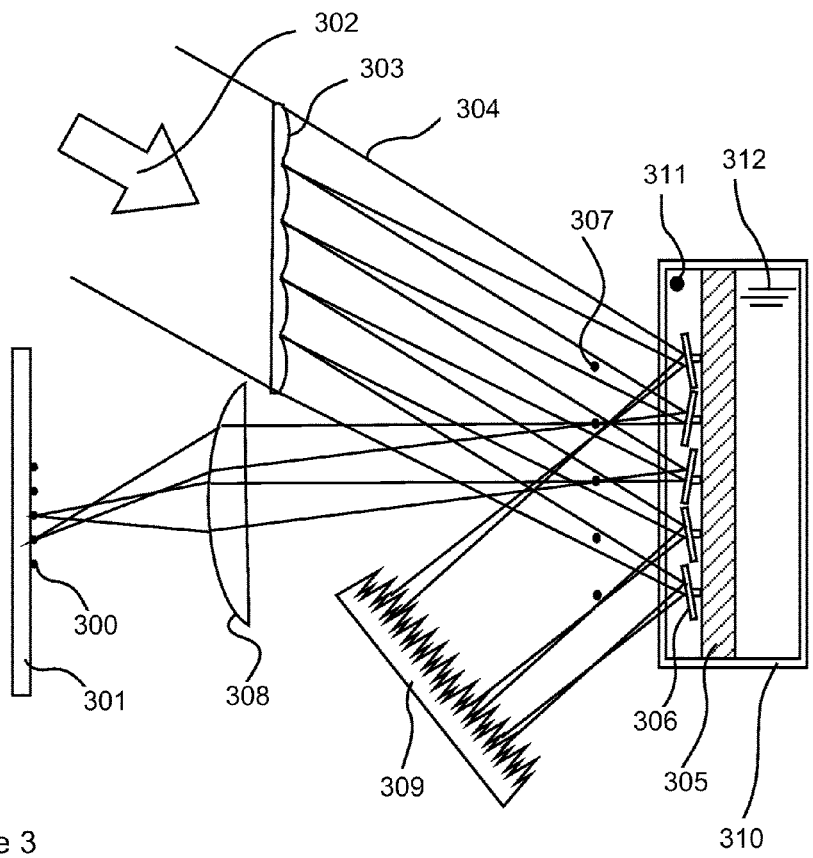
FIG. 3 shows a high-power embodiment of a laser ablation system.

Using the high-power embodiment of FIG. 3, it is possible to use short, intense pulses, to ablate thin solid films. The spot grid can be adjusted for an optimal match between the spot size and the density of spots, and if desired, a specified number of flashes delivered to each spot, e.g., 2, 4, 8 or other integer. Furthermore, the writing order of the spots can be chosen to make every spot fall in a "cold" neighborhood, i.e., where none of the surrounding grid points have been ablated within the last few flashes. With a dense grid of identical on-off spots and a writing strategy that still gives good address resolution, in contrast to a coarser grid of gray-tone pixels, the spot size, energy and pulse-length can be optimized for clean removal of the ablated film. Alternatively, ablation can be used to make pits or a surface profile in a solid surface in a controlled way, with the number of flashes delivered to a point being translated to an ablated depth into the surface.

Material is removed in a pattern that depends on adjacency of successive pulses on the workpiece and adjacency of pixels in a particular pulse. Some variations on pulse rate and pixel patterns are depicted in FIGS. 6A-F. Depending on the repetition rate and the scanning speed, successive pulses may indistinguishably overlap, partially overlap or appear as distinct spots. For instance, with a 1 micro meter diameter round spot of removal, a 1 meter per second sweep rate and a 1 MHz repetition rate, the resulting pattern would appear as cut-out spots that touch one another, but leaving material around the cut-outs. At a slower sweep speed, in FIG. 6B, a continuous sweep would result. With the same spot size and repetition rate, a (higher) 2 meter per second sweep would leave spots with a space between them similar in size to the spot size, FIG. 6D.

Figure 6A:
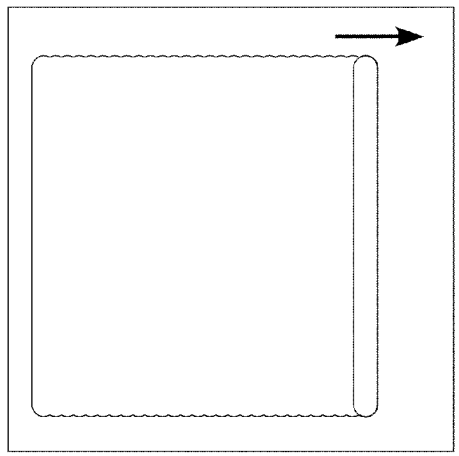
Figure 6B:
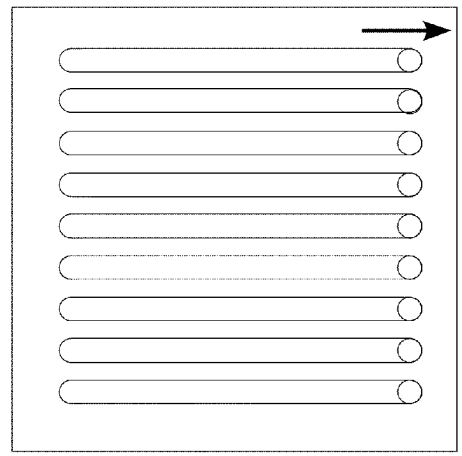
Figure 6C:
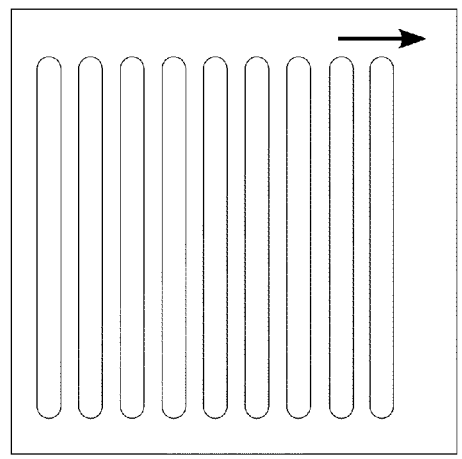
Figure 6D:
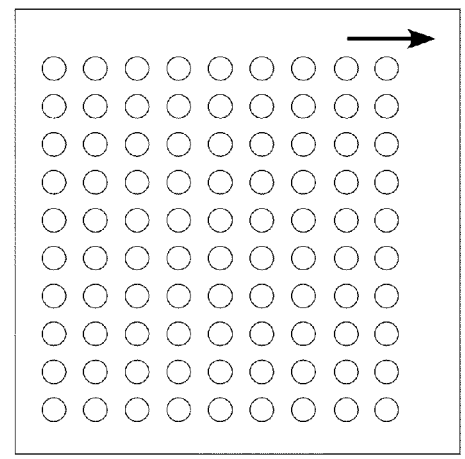

With close pixel spacing, radiation relayed from the SLM may appear as an unbroken line, FIG. 6A. This pulsating line may either be swept slowly, sweeping the surface FIG. 6A, or quickly, producing a sequence of lines, FIG. 6C.

In a two dimensional array of pixels, e.g. as in FIGS. 1B and 1D, some pixels may be offset from others in a rotated grid with axes that are not quite perpendicular. An example is shown in FIG. 6E. Ablating a second pass on top of the pattern in FIG. 6E will make the combined pattern surface-covering, FIG. 6F.

Figure 12:
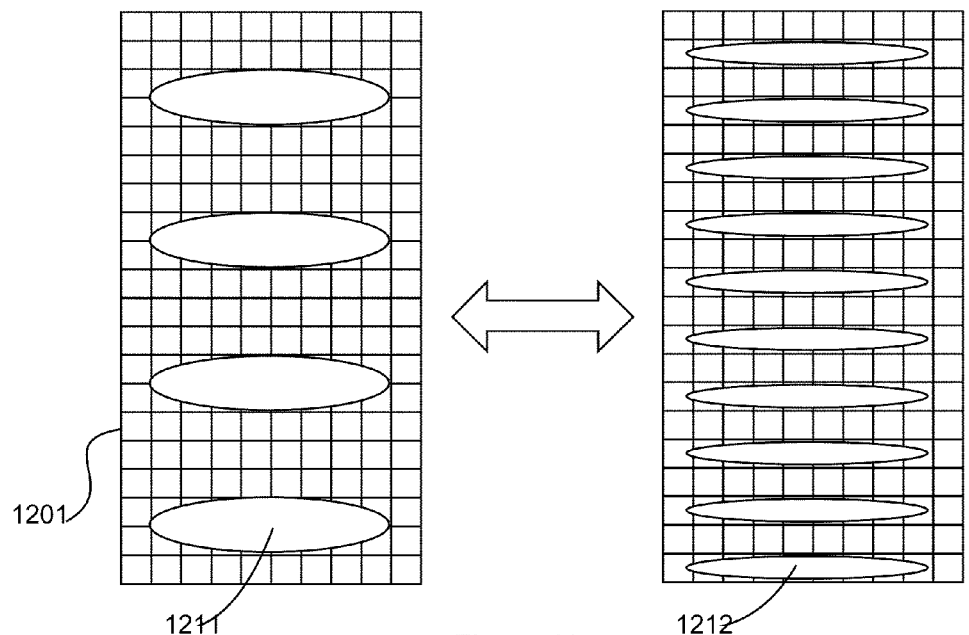
FIG. 12 depicts differing gangs of mirrors used to form single pixels on the same mirror array.

The arrangement in FIG. 1A with more SLM pixels than spots allows the position and spacing of the spots to be changed. FIG. 12 depicts differing gangs of mirrors used to modulate the beamlets on the same mirror array. In this way, a larger area giving more pulse energy can be assigned to each spot or more spots can be created for more data pixels per second, depending on the needs of the application. One option in an overall system is to use different beam splitters 203 for different applications. Interchangeable beam splitters could be fabricated, for instance as holograms, that produce in the illustration large or small illumination areas. The anamorphicity of the optics need to be adjusted at the same time, since the two cases have spots with different ellipticity. This can either be done by adjustment or by exchange of parts of the projection system 225, 235. The micro mirror array 1201, which appears in both the right and left sides of the figure, could be used for four pixels 1211 with significant separation between pixels or for ten pixels 1212 with relatively narrow separation. With appropriate control circuitry, the number of rows of mirrors in a single pixel and the number of rows of mirrors separating pixels can be selected to match the division of the beam into spots.

Since the beams are typically Gaussian in cross section they may overlap partly at the fringes and interference between two beams may create cross-talk. In order to pack the beams closer without excessive cross-talk, adjacent beams can be made to be non-interfering. A number of methods exist: adjacent beams can have opposite polarizations, e.g. right and left circular polarization. They can come from two lasers with slightly different frequencies, or, for short pulses, some spots may be delayed relative to their neighbors and arrive at the workpiece after their neighbors have ended.

Figure 13B:
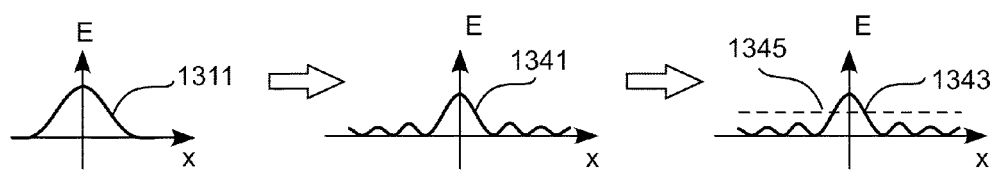
FIG. 13A-B illustrate optional conversion a Gaussian beam distribution to a top hat, super-resolving spot or similar distribution.
Figure 13A:
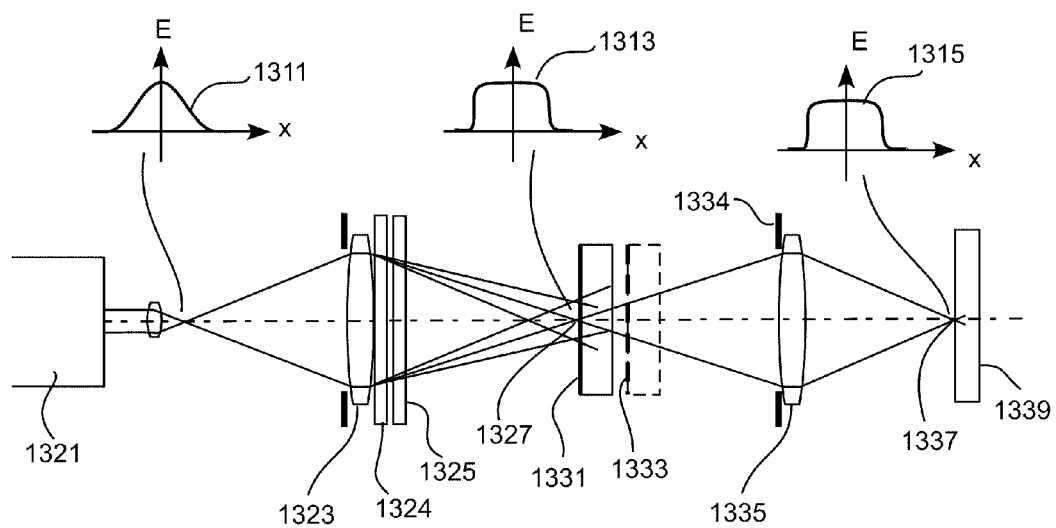

FIG. 13A illustrates optional conversion a Gaussian beam distribution to a top hat or similar distribution. Because ablation is a strongly non-linear effect a so-called top hat or flat-top distribution or a similarly uniform distribution is likely to work better than the Gaussian distribution which is typical of laser output. In FIG. 13, the original laser source 1321 produces a beam distribution 1311 that is Gaussian or similar. The laser beam is split by the beam splitter 1324 to a number of beams which are focused by the lens 1323 to form spots 1327 on the SLM 1331. The projection optics 1335, 1334 focus the light from the SLM onto the workpiece 1337. A filter 1325, typically a phase filter changes the shape of the spot from Gaussian to flat-top. The flat-top distribution makes the ablation of the workpiece more ideal, but may also be used to increase the spot size on the SLM without increasing the cross-talk. Likewise it is possible to increase the area each spot sees on the SLM by placing the SLM slightly out of focus 1333.

The same method can be used to improve the resolution of the system, namely by creating super-resolving spots 1343, FIG. 13B, instead of a flat-top. Since, at least in some applications ablation and other thermal processes have a threshold, the Gaussian spot may be transformed to a narrower central lobe with side lobes. There is a fundamental connection between making the central lobe more narrow and creating side lobes. In FIG. 13B a different filter than in FIG. 13A is selected to create a beam with the cross-section shown 1341 and said cross section is projected onto the workpiece 1343. The threshold on the workpiece is marked by 1345. The process, e.g. the ablation, happens only where the energy density is higher than the threshold 1345, i.e. in a smaller area than without the filter. The side lobes do not cause ablation.

Likewise, the disclosed technology's printing spots with a determined energy are suitable for non-linear processes, like thermal processing, fusion, melting, phase-transition, photolytic decomposition, selective activation, etc. Among these uses, laser transfer uses a material on a carrier film. When the material is hit with laser radiation it is selectively transferred to the workpiece. The technology disclosed works well with the general class of methods, which we may call "laser-induced pattern transfer," laser-induced thermal imaging LITI, radiation-induced sublimation transfer RIST, and laser-induced pattern-wise sublimation LIPS. Other processes used in the electronic, optical, and printing industry, where the disclosure may be useful, will be apparent to the person skilled in the art.

Figure 7:
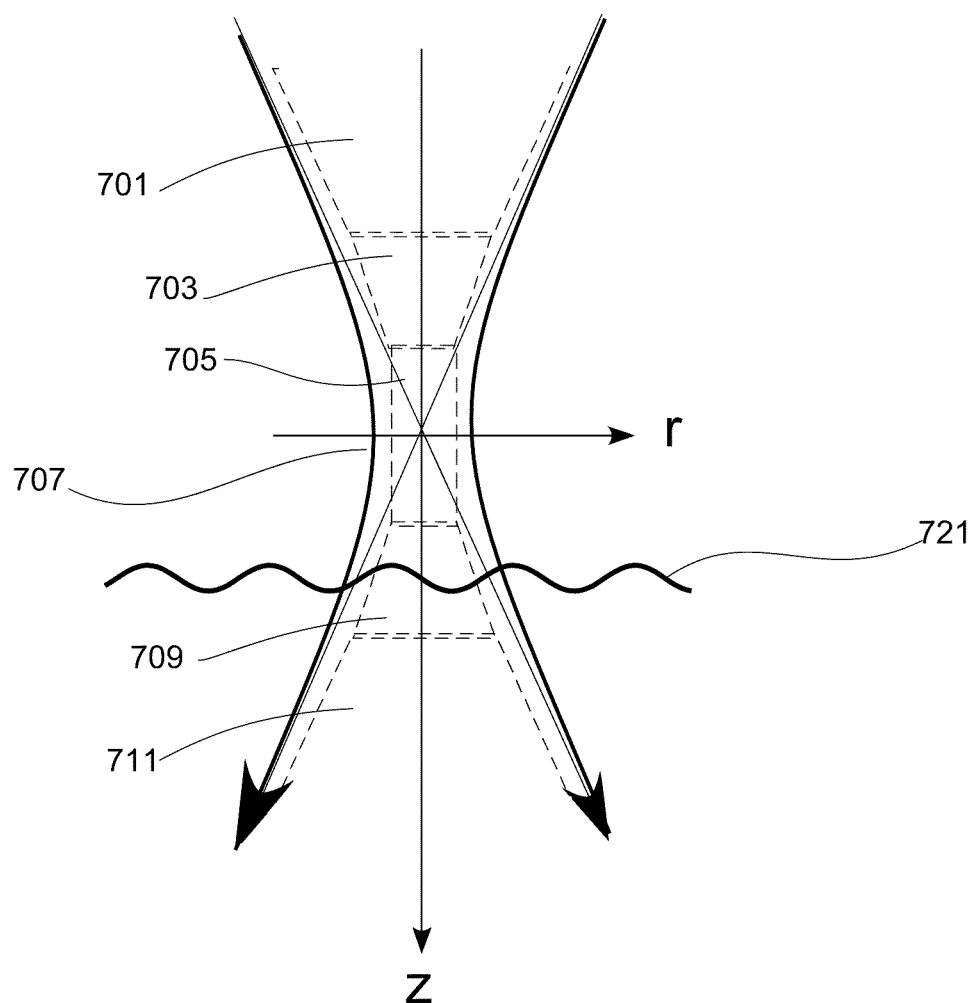
FIG. 7 show alternative ways how an area may be covered

One potential additional application of this technology is explained with reference to FIGS. 7-11. This technology involves taking advantage of what we call the focal depth of the effective ablation energy. In FIG. 7, we illustrate the convergence of energy density 701 to a focal plane or so-called waist 707 and subsequent divergence 711. A conventional measurement of the focal depth is a Rayleigh length, defined such that over one Rayleigh length along the axis of travel Z. The Rayleigh length is the distance from a beam waist 707 (which is more like a waist than a point of a cone) where the mode radius increased by a factor square root of 2. See 703, 709. As the radius increases by that factor, the energy density decreases by half In some practical designs such as a laser focused through a microscope, the Rayleigh length may be 200 nanometers and in low-NA optics it may be many millimeters. Beyond one Raleigh length, divergence is considered to continue as a cone.

In FIG. 7, the surface 721 below the beam waist is illustrated as undulating. One can see from the figure that the lower troughs of the surface are subject to less energy density than the higher crests. As a result, it is more likely that the crests will be ablated than the troughs. This has the favorable consequence of tending to planarize the surface.

Figure 8:
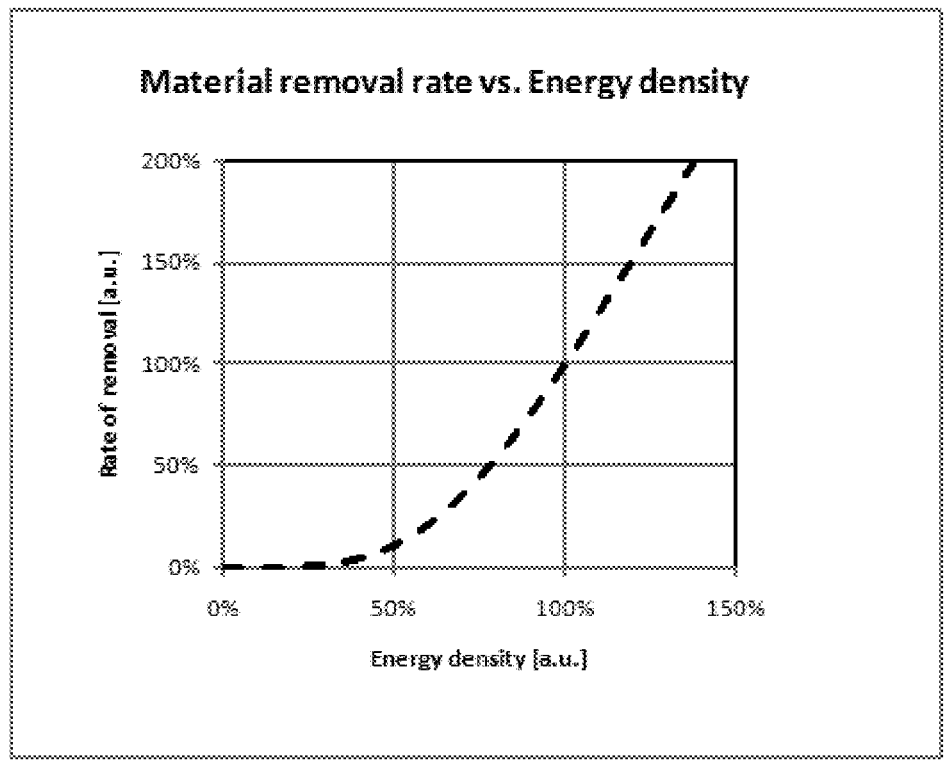
FIG. 8 shows how the material removal rate depends on the z distance in a planing configuration.

FIG. 8 depicts non-linearity of material removal below an energy density threshold, along relative units. At 50 percent energy density, a threshold has not been met and the removal rate, along a power function curve, is only 10-15 percent of the removal rate achieved at 100 percent energy density. As related to FIG. 7, if the waist region 707 produces a 100 percent removal rate, the bottom of the shaded trapezoid 709 will achieve only a 15 percent or so removal rate. While this does not fully planarize the surface, the crests 721 will be removed more quickly than the troughs, tending to reduce surface unevenness.

Figure 9:
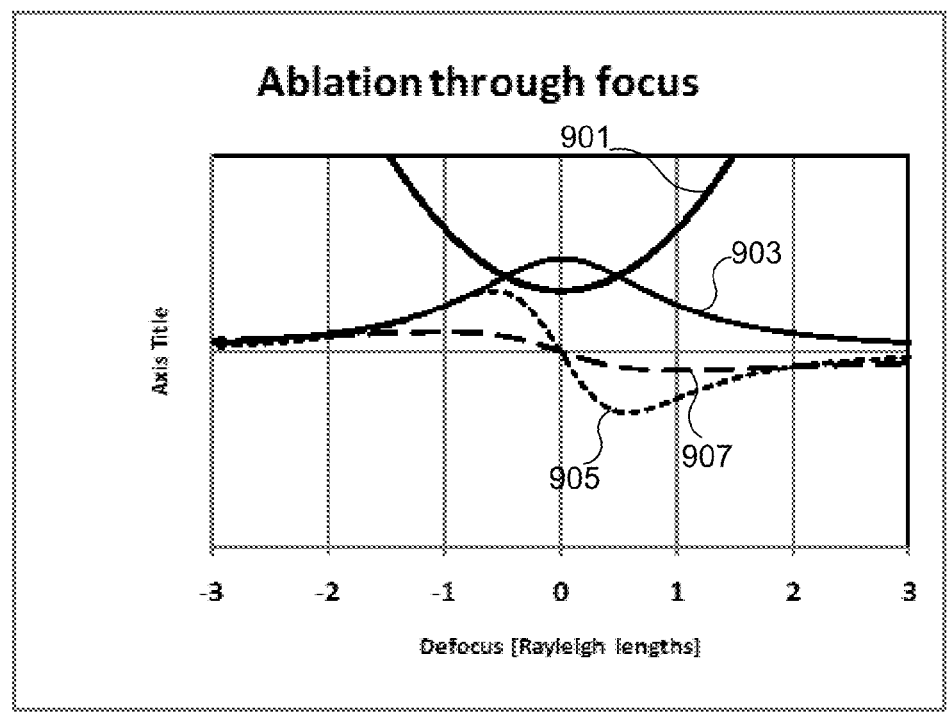
FIG. 9 depicts functions of the rate of material removal through focus.

FIG. 9 depicts functions of the rate of material removal through focus. The top curve 901, a parabola, represents the width of a beam at various distances from the beam waist. At the furthest distance, the beam is the widest. The curve 903 depicts the removal rate of material produced at a surface positioned at particular Rayleigh distances from the focal plane. The curve shows the removal in mass or thickness integrated over the surface. The short-dashed curve 905, with a pronounced crest and trough, is the derivative of the removal rate curve 903. It represents how quickly that removal rate changes when away from the focal plane along the removal rate curve. Finally, the long dashed curve 907 represents the derivative curve (short dashed) normalized by (divided by) the removal rate curve 903. The resulting long dashed curve is a proxy for effectiveness of planarizing. Reading the curve 905, the maximum differential in removal rate is about 0.5 Rayleigh lengths out of focus. This is where the short-dashed curve 905 has its max and min values, corresponding to the max and min slopes of the removal rate curve 903. On the other hand, significant material is likely to be removed from the entire surface when the planarized surface is within 0.5 Rayleigh lengths of the focal plane. Looking at the long dashed line 907, an operating range of 1-2 Rayleigh lengths defocus seems more favorable, if slower, because less material in total is removed by planarization. Accordingly, an operating range for planarization should lie between 0.25 Rayleigh lengths defocus under which planarizing is low and 2.0 Rayleigh lengths above which removal rate is low. For a combination of planarization and material removal, about 0.5 to 1.5 may be favorable. For less material removal and good planarization, 0.75 to 1.5 Rayleigh lengths or 1.0 to 2.0 Rayleigh lengths defocus may be better.

Figure 10:
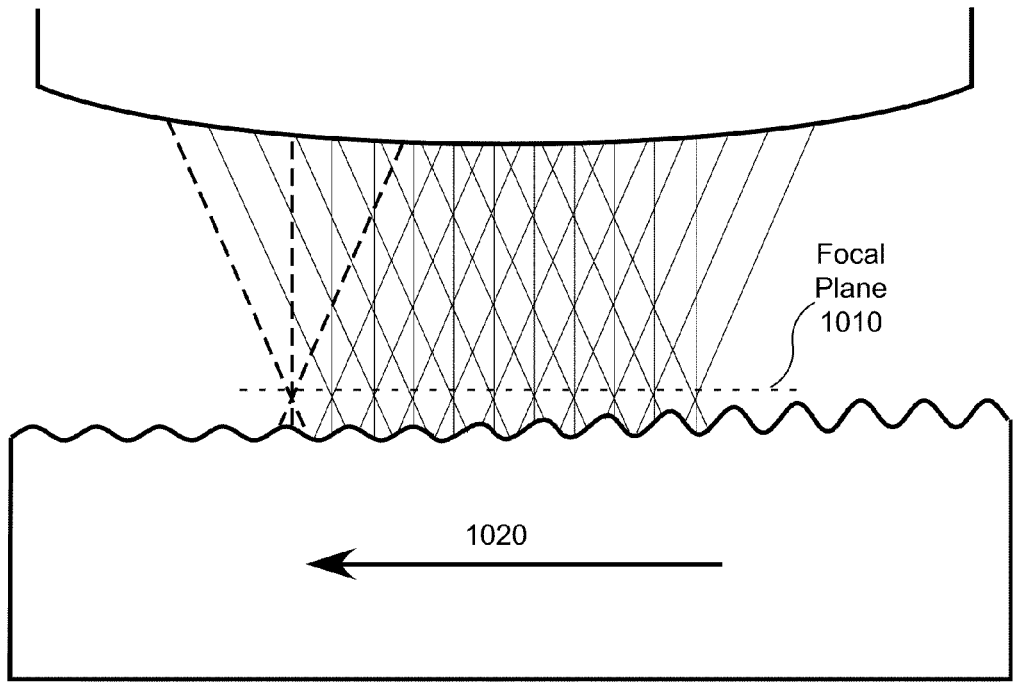
FIGS. 10-11 compare the operation of a system with a focal plane parallel to a substrate and one that has a tilted focal plane which is sometimes above and sometimes below a feature height of material on the substrate.
Figure 11:
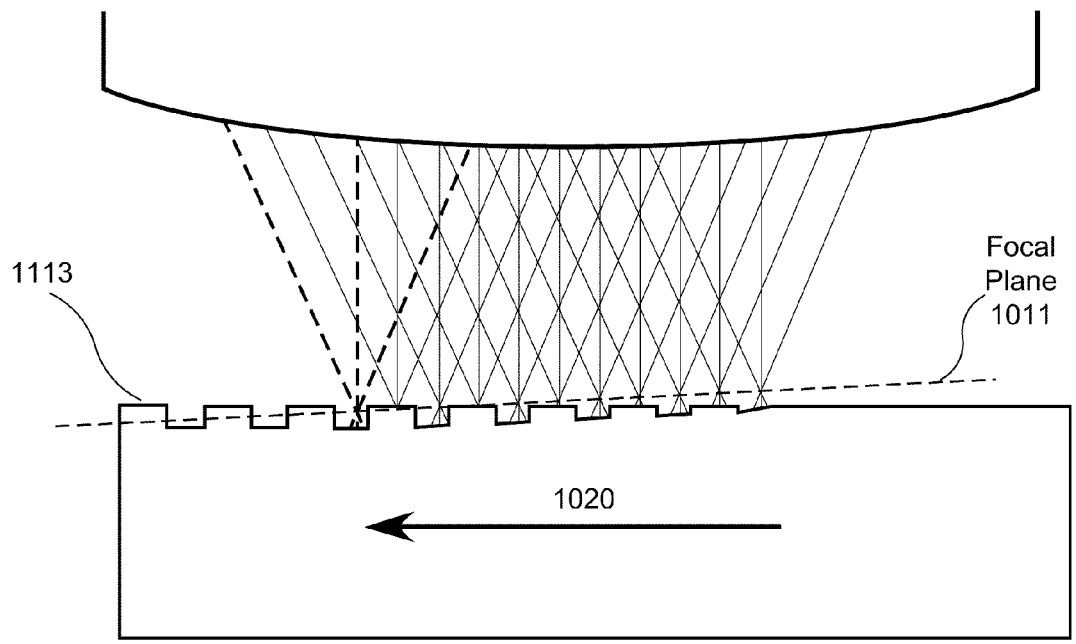

FIGS. 10-11 compare the operation of a system with a focal plane parallel to a substrate and one that has a tilted focal plane which is sometimes above and sometimes below a feature height of material on the substrate. Using a tilted focal plane allows faster ablation of material in relatively deep trenches. The substrate movement arrow 1020, 1120 indicates that the substrate surface first encounters the part of the focal plane 1111 that is highest, that is above the feature height. Creation of a trench begins. As the substrate moves and the focal plane drops to the feature height 1113 and then below the feature height, additional ablation pulses dig the trench deeper.

Some Particular Embodiments

The technology disclosed includes an apparatus for thermal or photochemical patterning of a workpiece. This apparatus includes an SLM with pixels composed of multiple micro mirrors. The mirrors operate in a diffractive mode. They may be driven by electrostatic forces set up by analog voltages. The mirrors can be tilting or moving piston-wise. Each pixel includes more than 5 micro mirrors which are phase coherent to each other, i.e. they may form an optical flat surface together or they may create a flat reflected waveplane. Alternatively, each pixel may include more than 10, 25 or 50 micro mirrors. As explained above, the use of multiple micro mirrors increases the power capacity of the system. The micro mirrors of the SLM are designed to operate at a reloading and repositioning frequency of high of 500 kHz or greater. Alternatively, the micro mirrors may operate a frequency of 1 MHz or greater or 2 MHz or greater. The apparatus further includes a workpiece stage that holds and moves a workpiece and a laser that emits short pulses with high energy. The pulses may be shorter than 100 ps. Alternatively, they may be shorter than 10 or 1 ps or longer than 1 ns. The average power of the laser is greater than or equal to 1 W. Alternatively, the average power may be greater than or equal to 5, 25 or 50 W. The apparatus further includes illumination optics coupling the laser to the SLM and creating an array of beamlets that illuminate the pixels on the SLM. Optionally, lenslets or apertures may be used to maintain separation between the beamlets and avoid diffraction effects among the beamlets. Alternatively, the beamlets could be scrambled so that they were non-interfering. For example, adjacent beams could be given opposite polarization states and therefore not interfere where they overlap. Some beams could be delayed, so that adjacent beams are non-interfering due to incoherence. For pulsed lasers this could be the same as a lack of overlap in time between the pulses of adjacent beams. The apparatus further includes demagnifying optics coupling the SLM to the workpiece and projecting modulated laser pulses onto the workpiece with a pulse energy density greater than or equal to 1 J/sq. cm. Alternatively, the pulse energy density on the workpiece demagnifying may be greater than or equal to 4 J/sq. cm. In certain applications, e.g., ablation of very thin films, the energy density could be larger than 0.1 J/sq. cm. The apparatus yet further includes a controller that feeds data the SLM and moves the workpiece stage in synchronicity with the pulses from the laser.

The apparatus and any of its alternatives or options may further include an SLM pixel clock. With this additional component, pulse repetition rate and pixel clock of the SLM may be effectively synchronized.

In the foregoing apparatus, the number of SLM pixels in the SLM may be greater than or equal to either 2048, 4096, or 8192. The number of beamlets projected onto the SLM may be greater than or equal to 1024, 2048, or 4096. Note that the number of micro mirrors and pixels may exceed the number of beamlets, because pixels on the SLM may be composed of more than one micro mirror and several SLM pixels may be used to control one beamlet.

Paralleling the apparatus disclosed is a method of thermal or photochemical patterning of the workpiece using an SLM with the multitude of more than 1000 micro mirrors. This method includes driving five or more adjoining mirrors as a pixel unit to a single amplitude value at a reload or repositioning frequency of 500 kHz or greater. Alternatively, the reload frequency may be one MHz or greater or 2 MHz or greater. The method further includes illuminating the SLM pixel units using a laser that emits pulses shorter than 100 ps with an average power greater than or equal to 1 W. Alternatively, the pulses may be shorter than 10 or 1 ps. The average power of illumination may be greater than or equal to 5, 25 or 50 W. The method further includes reloading the SLM with theta calculated to modulate the SLM and produce a pattern on the workpiece. It also includes relaying the modulated laser pulses from the SLM through demagnifying optics to the workpiece such that positively modulated laser pulses have a pulse energy density on the workpiece greater than or equal to 1 J/sq. cm. Alternatively, the energy density may be greater than equal to 4 J/sq. cm or greater than or equal to 0.1 J/sq. cm.

The method optionally may include controlling the SLM pixel clock and synchronizing a pulse repetition of the laser with the pixel clock of the SLM.

Applying this method, the number of micro mirrors in the SLM may be greater than or equal to 2048 or 4096.

Among the useful applications of technology disclosed, is using many mirrors of a micromechanical SLM with mutual phase coherence between them to form a high-power laser beam for processing of materials, e.g. ablation. This may be accompanied by using anamorphic optics to concentrate the energy from a two-dimensional area to a one-dimensional array of spots.

The SLM can be applied arranging spots in a row, and scanning a workpiece generally in a direction aligned with that row, thereby gaining a high update rate and high average power for a given pulse energy.

We have disclosed calibrating the power of individual beams by the analog function of the mirrors. By analog function, we mean analog voltage from a DAC that drives the mirror tilt.

The method and corresponding device provide an array of mirrors, an optical beam splitter and anamorphic optics, the latter two being adjustable or changeable to hit different trade-offs between pixel rate and power per spot. Different numbers of beams can be trained on the array of mirrors, resulting in different numbers and powers of imaged spots.

We have described ablating a surface between 0.25 and 2 Rayleigh lengths below the focus plane using an array of high-NA (>0.25) spots for improved depth control.

We have illustrated using a filter in the ablating system which modifies the focal spot from Gaussian distribution to a different desired shape, such as flat-top or top hat, super-resolving.

In some implementations, we teach using orthogonal or at least differing polarizations on neighboring spots to decrease cross-talk and allow denser beamlet pitch.

The technology disclosed may be embodied in a non-transitory storage medium including computer instructions. This non-transitory storage medium may include computer instructions that, when combined with hardware, cause the hardware to carry out any of the methods described above. Alternatively, the non-transitory storage medium may include computer instructions that, when loaded onto hardware, produce any of the apparatus described above.

The technology disclosed also may be computer software. The computer software when loaded onto appropriate hardware may carry out any of the methods described above. Alternatively, the computer software may, when loaded onto hardware, produce any of the apparatuses described above.

We claim as follows:

1. An apparatus for thermal or photochemical patterning of a workpiece, including:
   - an essentially one-dimensional SLM with pixels, each pixel including more than five diffractive micro mirrors with an operating frequency for micro mirror reloading and repositioning of 500 KHz or greater;
   - a workpiece stage that holds and moves a workpiece;
   - a laser that emits pulses shorter than 100 ps with an average power greater than or equal to 1 watt;
   - illumination optics that couple the laser to the SLM and that create an array of beamlets that illuminate pixels of the SLM;
   - demagnifying optics that couple the SLM to the workpiece and that projects modulated laser pulses with a pulse energy density on the workpiece greater than or equal to 1 J/sq. cm; and
   - a controller that feeds data to the SLM and that moves the workpiece stage in synchronicity with the pulses from the laser.

2. The apparatus of claim 1, wherein each pixel includes 10-24 micro mirrors.

3. The apparatus of claim 1, wherein each pixel includes 25-49 micro mirrors.

4. The apparatus of claim 1, wherein each pixel includes more than 50 micro mirrors.

5. The apparatus of claim 1, wherein the micro mirrors operate a frequency of 1 MHz or greater.

6. The apparatus of claim 1, wherein the micro mirrors operate a frequency of 2 MHz or greater.

7. The apparatus of claim 1, wherein the laser emits pulses shorter than 10 ps.

8. The apparatus of claim 1, wherein the laser emits pulses shorter than 1 ps.

9. The apparatus of claim 1, wherein the laser emits pulses with an average power greater than or equal to 5 watts.

10. The apparatus of claim 1, wherein the laser emits pulses with an average power greater than or equal to 25 watts.

11. The apparatus of claim 1, wherein the demagnifying optics coupling the SLM to the workpiece and project modulated laser pulses with a pulse energy density on the workpiece greater than or equal to 4 J/sq. cm.

12. The apparatus of claim 1, wherein the SLM is controlled by a pixel clock and further including a pulse repetition which is effectively synchronized with the pixel clock of the SLM.

13. The apparatus of claim 1, wherein the number of micro mirrors on the SLM is greater than or equal to 2048.

14. The apparatus of claim 1, wherein the number of micro mirrors on the SLM is greater than or equal to 4096.

15. The apparatus of claim 1, wherein the number of beamlets is greater than or equal to 1024.

16. The apparatus of claim 1, wherein the number of beamlets is greater than or equal to 2048.

17. A method of thermal or photochemical patterning of a workpiece using an SLM with a multitude of more than 1000 micro mirrors, including:
   - driving five or more adjoining micro mirrors as a pixel unit to a single amplitude value at a reload and repositioning frequency of 500 KHz or greater;
   - illuminating the SLM pixel units using a laser that emits pulses shorter than 100 ps with an average power greater than or equal to 1 watt;
   - reloading the SLM with data calculated to modulate the SLM and produce a pattern on the workpiece; and
   - relaying the modulated laser pulses from the SLM through demagnifying optics to the workpiece such that positively modulated laser pulses have a pulse energy density on the workpiece greater than or equal to 1 J/sq. cm.

18. The method of claim 17, wherein each pixel unit includes more than 10 micro mirrors.

19. The method of claim 17, wherein each pixel unit includes more than 25 micro mirrors.

20. The method of claim 17, wherein each pixel unit includes more than 50 micro mirrors.

21. The method of claim 17, further including driving the micro mirrors at a frequency of 1 MHz or greater.

22. The method of claim 17, further including driving the micro mirrors operate a frequency of 2 MHz or greater.

23. The method of claim 17, wherein the laser emits pulses shorter than 10 ps.

24. The method of claim 17, wherein the laser emits pulses shorter than 1 ps.

25. The method of claim 17, wherein the laser emits pulses with an average power greater than or equal to 5 watts.

26. The method of claim 17, wherein the laser emits pulses with an average power greater than or equal to 25 watts.

27. The method off claim 17, wherein the demagnifying relay the modulated pulses with a pulse energy density on the workpiece greater than or equal to 4 J/sq. cm.

28. The method of claim 17, there in the SLM is controlled by a pixel clock and synchronizing a pulse repetition of the laser with the pixel clock of the SLM.

29. The method of claim 17, wherein the number of micro mirrors on the SLM is greater than or equal to 2048.

30. The method of claim 17, wherein the number of micro mirrors on the SLM is greater than or equal to 4096.

* * * * *